(12) United States Patent
Lee et al.

(10) Patent No.: US 7,208,341 B2
(45) Date of Patent: Apr. 24, 2007

(54) METHOD FOR MANUFACTURING PRINTED CIRCUIT BOARD

(75) Inventors: Kwang-Tae Lee, Gyeonggi-Do (KR);
Sung-Gue Lee, Gyeonggi-Do (KR);
Sang-Hyuck Nam, Gyeonggi-Do (KR);
Sung-Ho Youn, Seoul (KR);
Young-Kyu Lee, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 186 days.

(21) Appl. No.: 10/855,557

(22) Filed: May 28, 2004

(65) Prior Publication Data

US 2004/0241904 A1 Dec. 2, 2004

(30) Foreign Application Priority Data

May 30, 2003 (KR) .................. 10-2003-0034920

(51) Int. Cl.
*H01L 21/48* (2006.01)
*H01L 21/4763* (2006.01)

(52) U.S. Cl. .................. 438/106; 438/618; 438/622

(58) Field of Classification Search .............. 438/106, 438/618, 622, 125
See application file for complete search history.

(56) References Cited

U.S. PATENT DOCUMENTS 4,211,603 A * 7/1980 Reed ........................ 216/18
5,948,514 A * 9/1999 Komori et al. ............. 428/209
2004/0134682 A1 * 7/2004 En et al. .................... 174/258

FOREIGN PATENT DOCUMENTS

JP 01-290291 11/1989
JP 02-283095 11/1990

* cited by examiner

*Primary Examiner*—Michael Trinh
(74) *Attorney, Agent, or Firm*—KED & Associates, LLP

(57) ABSTRACT

A method for manufacturing a printed circuit board includes: forming inner circuit patterns in an insulating material in multi-layers, forming a plurality of through holes at certain portions of the insulating material, and forming an outer circuit pattern which is electrically connected to the inner circuit pattern, at an inner circumferential surface of the through hole and the surface of the insulating material, and a terminal portion; forming a first photo solder resist layer at an entire surface of the insulating material and an entire surface of the outer circuit pattern, and exposing the terminal portion by removing a specific portion of the first photo solder resist layer; abrading the surface of the first photo solder resist layer; printing a second photo solder resist layer at the surface of the first photo solder resist layer, and exposing the terminal portion to the outside by removing a specific portion of the second photo solder resist layer; and forming a pad portion by plating the surface of the exposed terminal portion with gold, and electrically connecting the pad portion and the terminal portion.

7 Claims, 9 Drawing Sheets

METHOD FOR MANUFACTURING PRINTED CIRCUIT BOARD

BACKGROUND OF THE INVENTION

1. Field of the Invention

The present invention relates to a method for manufacturing a printed circuit board, and particularly, to a method for manufacturing a printed circuit board capable of easily manufacturing a printed circuit board with a simple process in manufacturing a printed circuit board having a surface exposed to an outside of a product such as a memory card.

2. Description of the Background Art

In general, a printed circuit board is being used for electronic machines or products in various forms. Particularly, in case of a portable memory card having a printed circuit board exposed to an outside of a product, flatness of a surface of the printed circuit board greatly affects quality of a product.

Figure 1:
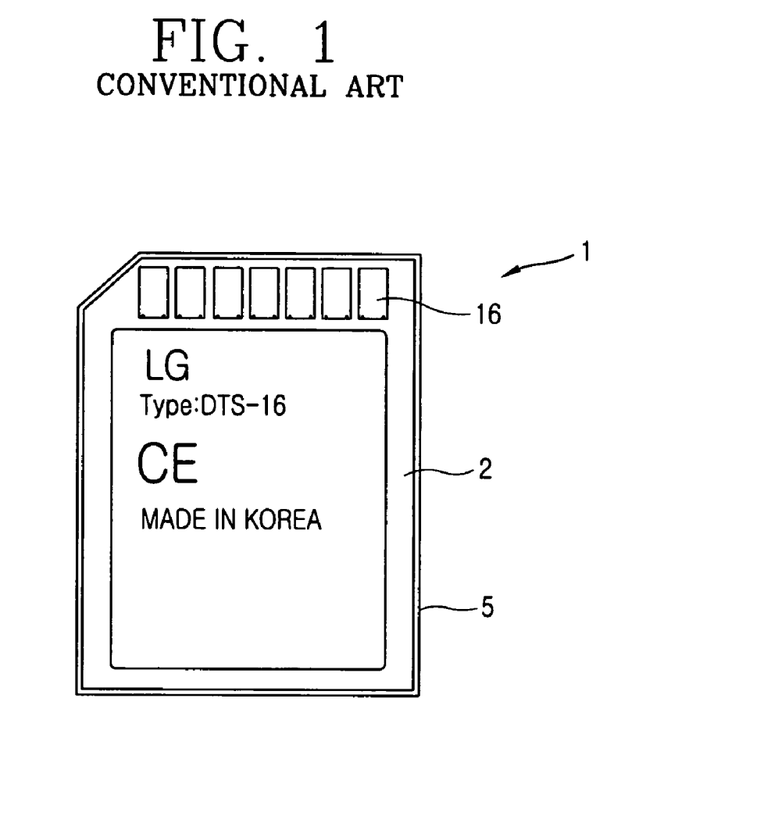
FIG. 1 is a bottom view showing a general memory card.
Figure 2:
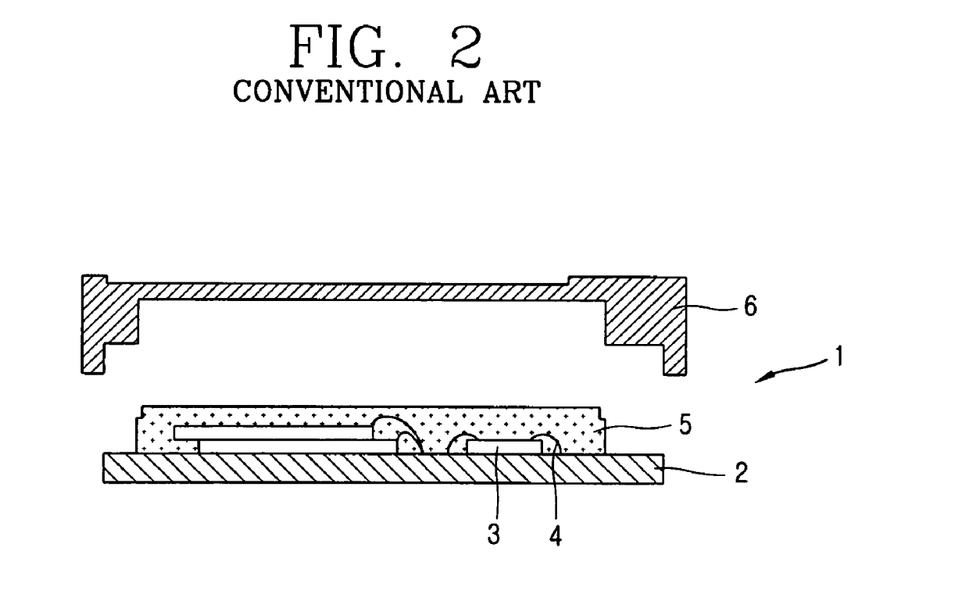
FIG. 2 is a longitudinal sectional view showing a general memory card.

FIG. 1 is a bottom view showing a general memory card, and FIG. 2 is a longitudinal sectional view showing a general memory card.

As shown therein, a general memory card 1 is formed such that a semiconductor element 3 is mounted at a surface of a printed circuit board 2, and a lead 4 of the semiconductor element 3 is electrically connected to a pad portion 16. An upper portion of the semiconductor element 3 is covered with a molding 5, and a cap 5 is coupled to an upper portion of the molding 5.

Since a surface of the printed circuit board 2 of the memory card 1, where the semiconductor element is not mounted, is exposed to an outside of a product, as described above, the flatness of the surface of the printed circuit board 2 greatly affects quality of a product.

Hereinafter, a method for manufacturing a conventional printed circuit board for improving flatness of a surface of a printed circuit board, will now be described.

FIGS. 3A to 3F are views showing a conventional method for manufacturing a printed circuit board.

Figure 3A:
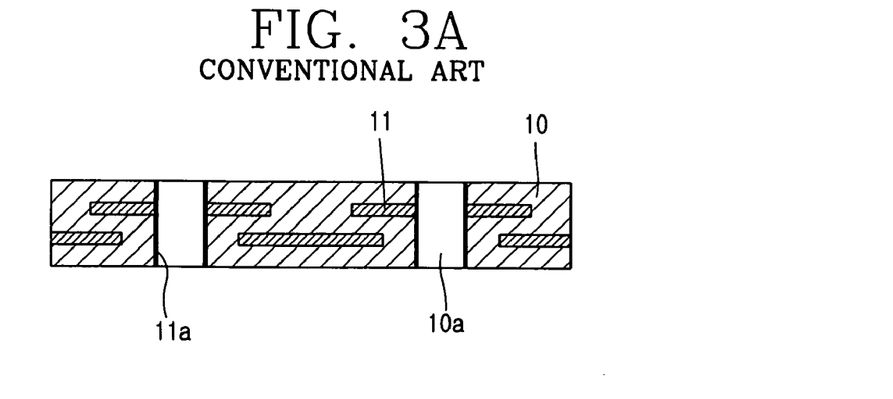
FIGS. 3A to 3F are longitudinal sectional views that sequentially show a conventional method for manufacturing a printed circuit board.

First, as shown in FIG. 3A, in the conventional method for manufacturing a printed circuit board, inner circuit patterns 11 are formed inside an insulating material in multi-layers, and a plurality of through holes 10a are formed at certain portions of the insulating material 10.

Figure 3B:
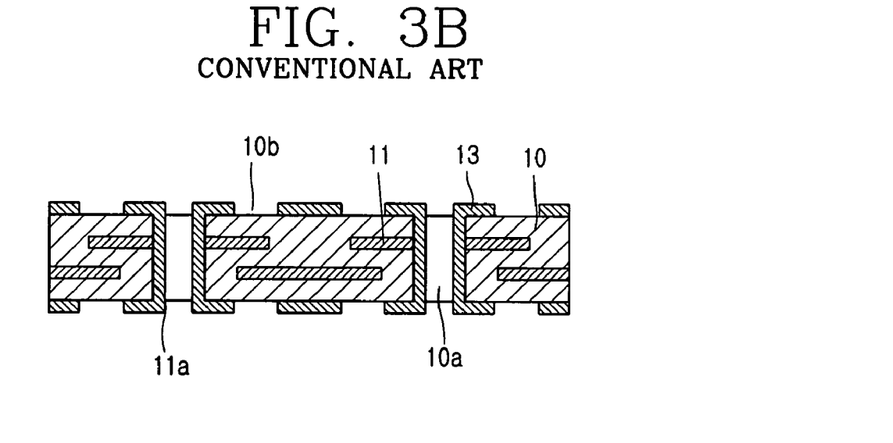

Then, as shown in FIG. 3B, a copper sheet 11a is formed inside the through hole 10a to electrically connect the inner circuit patterns 11 and an outer circuit pattern 13 to be described later.

An outer circuit pattern 13 is formed at an inner circumferential surface of the through hole 10a and the surface of the insulating material 10 so as to be electrically connected to the inner circuit pattern 11. Then, a specific portion of the outer circuit pattern 13 is exposed to light and developed to be removed.

Figure 3C:
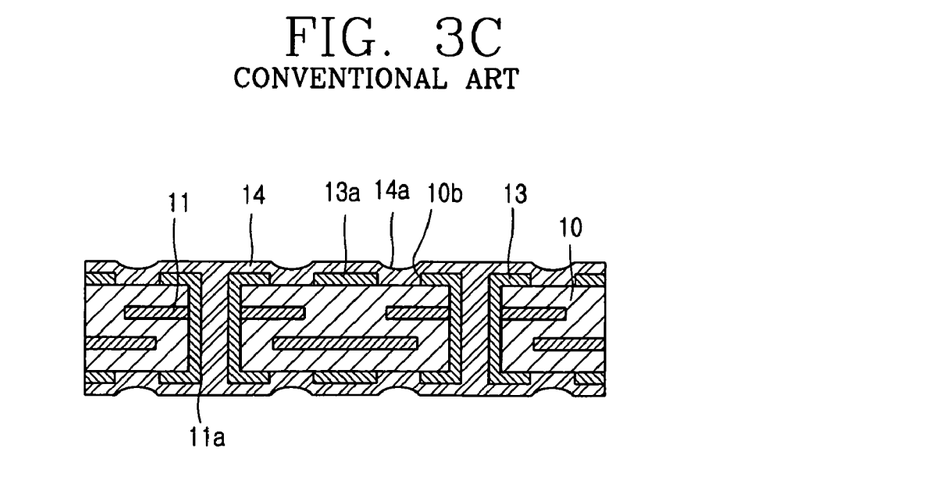

Then, as shown in FIG. 3C, to protect the outer circuit pattern 13, a solder resist layer 14 of general ink or general resin is formed at the entire surface of the insulating material 10 and the entire surface of the outer circuit pattern 13. At this time, solder resist layer 14 is also filled in the through hole 10a, and a sinking portion 14a is formed at a specific portion of the solder resist layer 14 because of a groove 10b (refer to FIG. 3B) generated by the exposure to light and a development.

The sinking portion 14a is generated as the specific portion of the solder resist layer 14 is depressed at the groove 10b in a process of applying solder resist layer 14 to the entire surface of the insulating material 10 and the entire surface of the outer circuit pattern 13.

Figure 3D:
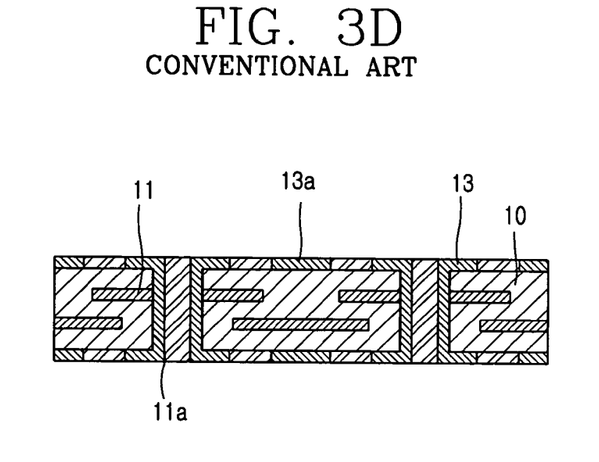

Then, as shown in FIG. 3D, through an abrading process, the surface of the solder resist layer 14 is flattened.

At this time, the entire surface of the solder resist layer 14 is uniformly abraded until the sinking portion 14a (refer to FIG. 3C) is removed, and a portion 13a (hereinafter, referred to as terminal portion) of the outer circuit pattern 13, which is connected to a semiconductor element (not shown) is exposed.

Figure 3E:
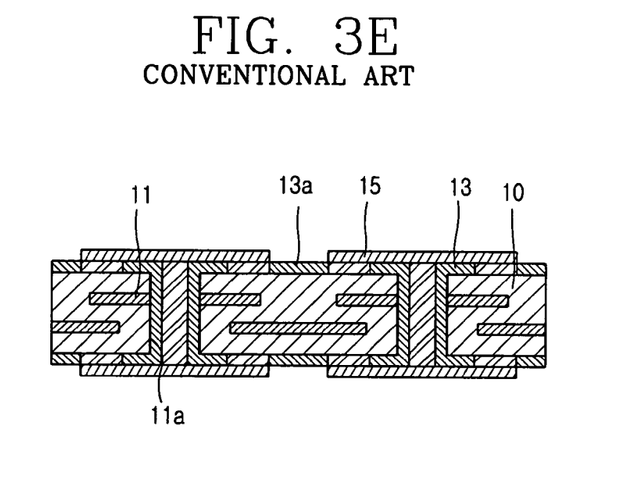

Then, as shown in FIG. 3E, after the surface is uniformly abraded so that the terminal portion 13a and the solder resist layer 14 are the same in height, a photo solder resist layer 15 is printed at the surface. Then, a specific portion of the photo solder resist layer 15 is exposed to light and developed to thereby expose the terminal portion 13a covered with the photo solder resist layer 15, again.

Figure 3F:
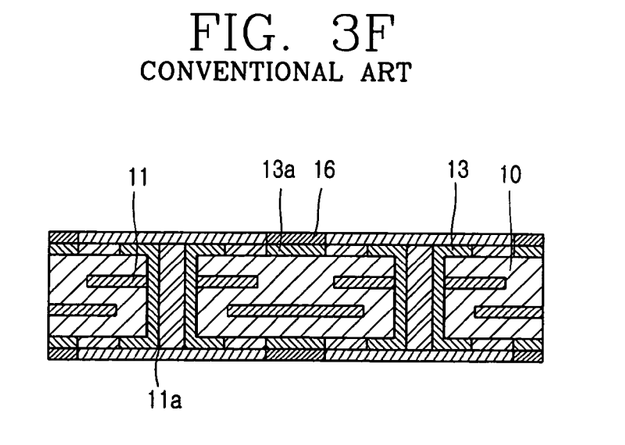

Then, as shown in FIG. 3F a pad potion 16 is formed by gold-plating the terminal portion 13a, and thus the pad portion 16 is electrically connected to the terminal portion 13a. In this manner, a printed circuit board is completed.

However, the conventional method for manufacturing a printed circuit board has following problems.

In an abrading process for removing a sinking portion of the solder resist layer in order to flatten the surface of the solder resist layer, when the solder resist layer is abraded, the thickness of the terminal portion has to be finely maintained as thick as a planned measurement. However, since the printed circuit board itself is very thin, it is very difficult to perform the abrading operation, maintaining the planned measurement in an actual abrading process.

Figure 4A:
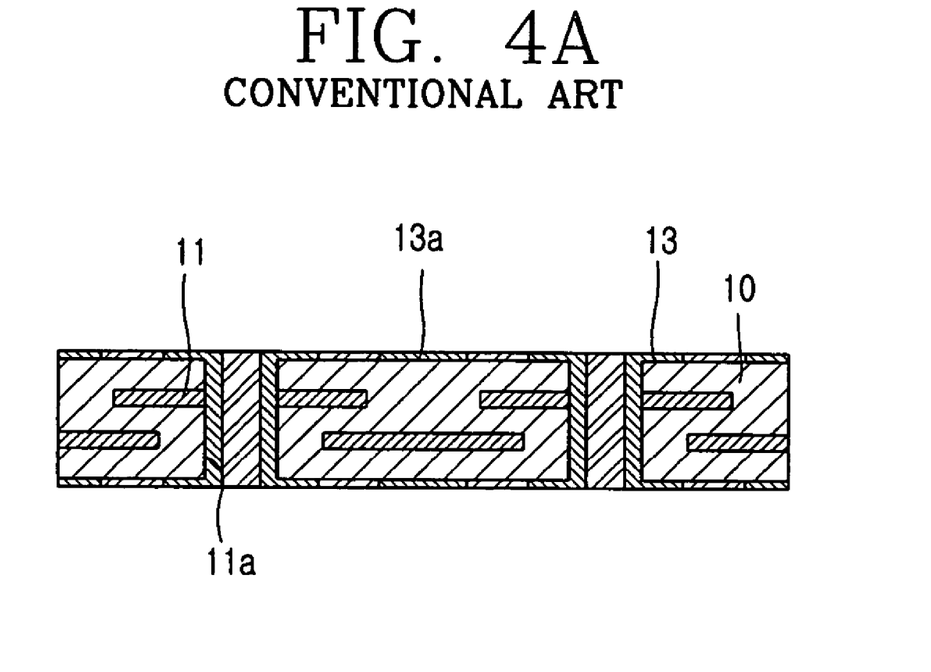
FIG. 4A is a longitudinal sectional view showing that a thickness of a terminal portion becomes too thin since the abraded amount is excessive in an abrading process.
Figure 4B:
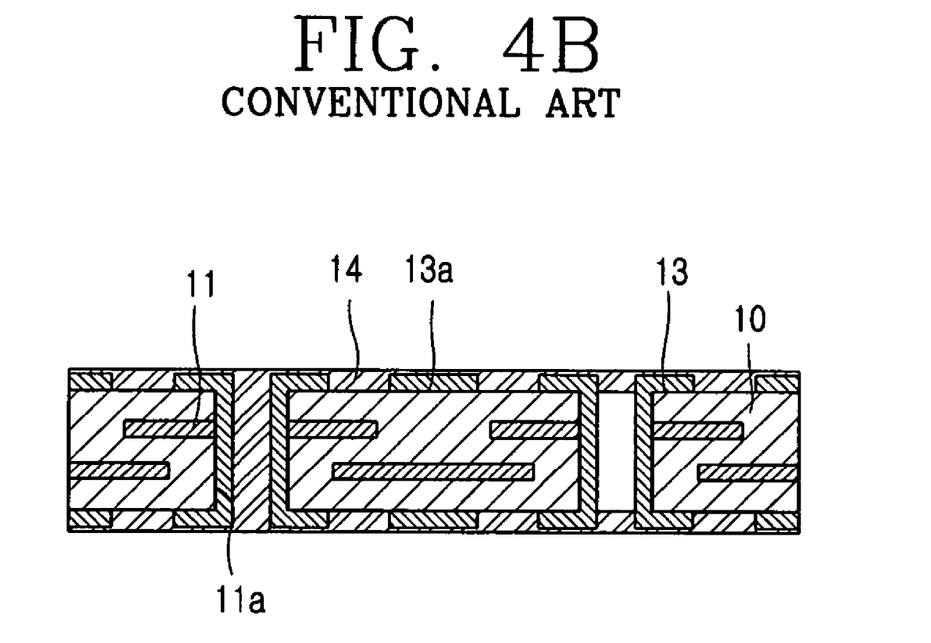
FIG. 4b is a longitudinal sectional view showing that a terminal portion is not exposed to the outside since the abraded amount is insufficient, and thus a solder resist layer cannot be fully removed.

In the abrading process, if the solder resist layer is abraded too much, the thickness of the terminal portion becomes too thin as shown in FIG. 4A. In contrast, as shown in FIG. 4B, if the solder resist layer is insufficiently abraded, the solder resist layer cannot be fully abraded, and thus the terminal portion cannot be exposed to the outside. Accordingly, performance of the printed circuit board is degraded, and a mal-operation occurs.

SUMMARY OF THE INVENTION

Therefore, an object of the present invention is to provide a method for manufacturing a printed circuit board capable of improving manufacturing efficiency and a yield of a product.

Another object of the present invention is to provide a method for manufacturing a printed circuit board capable of improving performance of a printed circuit board, preventing a mal-operation and easily manufacturing a printed circuit board.

To achieve these and other advantages and in accordance with the purpose of the present invention, as embodied and broadly described herein, there is provided a method for manufacturing a printed circuit board comprising: forming inner circuit patterns in an insulating material in multi-layers, forming a plurality of through holes at certain portions of the insulating material, and forming an outer circuit pattern which is electrically connected to the inner circuit pattern, at an inner circumferential surface of the through hole and the surface of the insulating material, and a terminal portion; forming a first photo solder resist layer at an entire surface of the insulating material and an entire surface of the outer circuit pattern, and exposing the terminal portion by removing a specific portion of the first photo solder resist layer; abrading the surface of the first photo solder resist layer; printing a second photo solder resist layer at the surface of the first photo solder resist layer, and exposing the terminal portion to the outside again by removing a specific portion of the second photo solder resist layer; and forming a pad portion by plating the surface of the exposed terminal portion with gold, and electrically connecting the pad portion and the terminal portion.

Photosensitive ink or photosensitive epoxy resin is used for the first and second photo solder resist layer.

In the abrading process, the surface of the first photo solder resist layer is abraded just as much as a sinking portion can be removed.

The second photo solder resist layer is printed at the entire surface of the first photo solder resist.

In the step of removing the specific portions of the first photo solder resist layer and the second photo solder resist layer, the specific portions of the first photo solder resist layer and the second photo solder resist layer are exposed to a UV beam and then developed.

Through the exposure to the UV beam and the developing, a pad portion groove for forming a pad portion is formed at the specific portion of the second photo solder resist.

After the pad portion is formed, the surface of the second photo solder resist layer and the surface of the pad portion are flattened.

To achieve these and other advantages and in accordance with the purpose of the present invention, as embodied and broadly described herein, there is provided a method for manufacturing a printed circuit board comprising: forming inner circuit patterns in an insulating material in multi-layers, forming a plurality of through holes at certain portions of the insulating material, and forming an outer circuit pattern which is electrically connected to the inner circuit pattern, at an inner circumferential surface of the through hole and the surface of the insulating material, and a terminal portion; forming a first photo solder resist layer at an entire surface of the insulating material and an entire surface of the outer circuit pattern; abrading a surface of the first photo solder resist; printing a second photo solder resist layer at the surface of the first photo solder resist layer, and removing the specific portions of the first and second photo solder resists layers to thereby form a pad portion groove for forming a pad portion at a specific portion of the second photo solder resist layer and simultaneously expose the terminal portion to the outside; and forming a pad portion by plating the surface of the exposed terminal portion with gold and electrically connecting the pad portion and the terminal portion.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings:

FIGS. 5A to 5G are longitudinal sectional views that sequentially show a method for manufacturing a printed circuit board in accordance with a first embodiment of the present invention.

DETAILED DESCRIPTION OF THE PREFERRED EMBODIMENTS

Reference will now be made in detail to the preferred embodiments of the present invention, examples of which are illustrated in the accompanying drawings.

FIGS. 5A to 5G are longitudinal sectional views that sequentially show a method for manufacturing a printed circuit board in accordance with a first embodiment of the present invention.

Figure 5A:
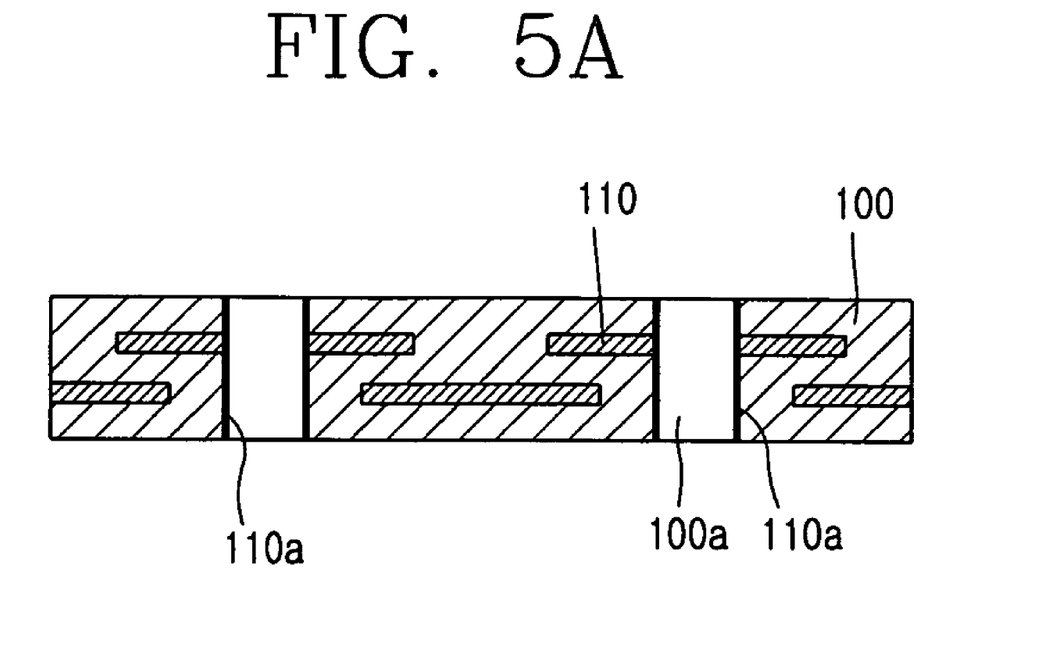

In the method for manufacturing a printed circuit board in accordance with the first embodiment of the present invention, as shown in FIG. 5A, inner circuit patterns 110 are formed in an insulating material 100 in multi-layers, and a plurality of through holes 100a are formed at certain portions of the insulating material 100.

Figure 5B:
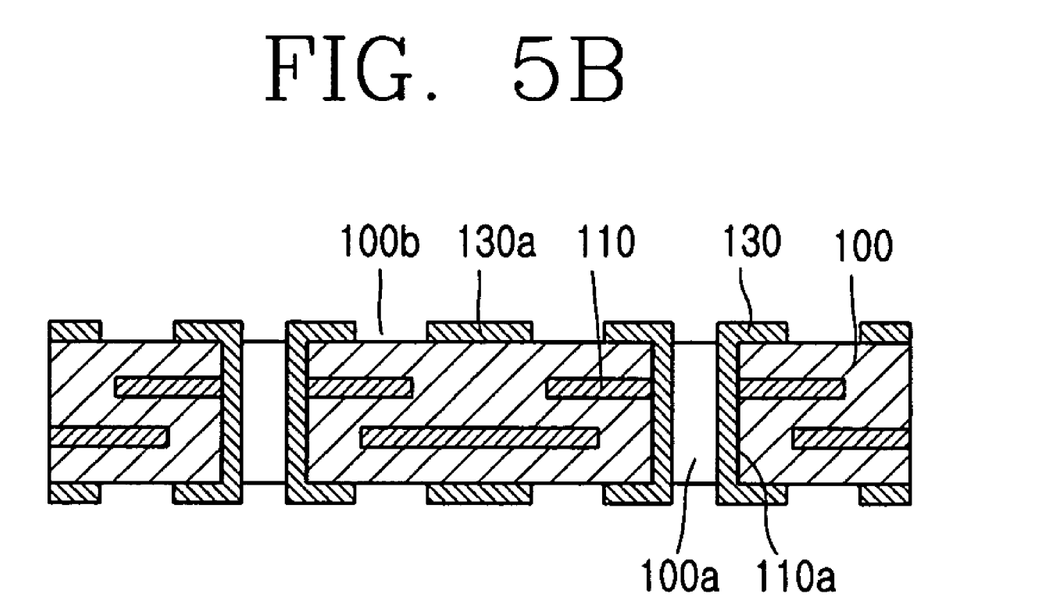

Then, as shown in FIG. 5B, a copper sheet 110a is formed inside the through hole 100a to electrically connect the inner circuit pattern 110 and an outer circuit pattern 130 to be described later.

An outer circuit pattern 130 is formed at an inner circumferential surface of the through hole 100a and a surface of the insulating material 100 and electrically connected to the inner circuit pattern 110. Then, a specific portion of the outer circuit pattern 130 is exposed to light and developed to be removed.

Then, as shown in FIG. 5C, to protect the outer circuit pattern 130, a first photo solder resist layer 140 is formed at an entire surface of the insulating material 100 and an entire surface of the outer circuit pattern 130.

At this time, the first photo solder resist layer 140 is also filled in the through hole 100a.

A sinking portion 140a is formed at the specific portion of the first photo solder resist layer 140 by grooves 100b formed by the exposure to light and the developing.

The sinking portion 140a is generated as the specific portion of the first photo solder resist layer 140 is depressed by the groove 100b in a process of applying the first photo solder resist layer 140 onto the entire surface of the insulating material 100 and the entire surface of the outer circuit pattern 130.

Figure 5D:
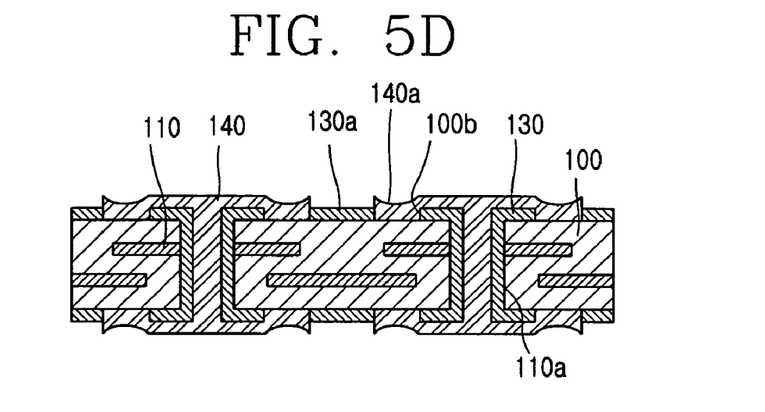

Then, as shown in FIG. 5D, the first photo solder resist layer 140 is exposed to a UV beam. Then, through a developing process using alkali chemicals, such as sodium carbonate, a part of the first photo solder resist layer 140 covering the surface of the terminal portion 130a is removed to expose the terminal portion 130a.

At this time, photosensitive ink or photosensitive epoxy resin is used for the first photo solder resist layer 140.

Figure 5E:
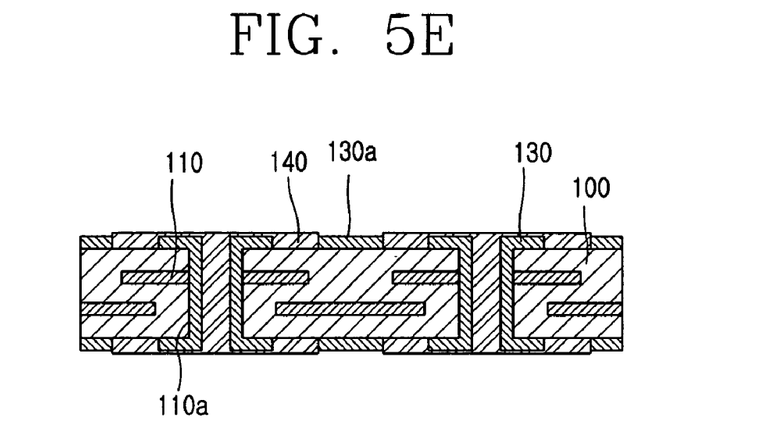

Then, as shown in FIG. 5E, the surface of the first photo solder resist layer 140 is flattened through an abrading process. At this time, the entire surface of the first photo solder resist layer 140 is uniformly abraded just as much as the sinking portion 140a (refer to FIG. 5) can be removed, that is, as deep as the depth of the depression portion 140a.

Unlike the conventional method for manufacturing a printed circuit board, in the method for manufacturing a printed circuit board in accordance with the first embodiment of the present invention, since the terminal portion 130a is exposed to the outside by exposure to a UV beam and developing in a preceding step of an abrading process, the first photo solder resist layer 140 is abraded in the abrading process just as much as the sinking portion 140a can be removed.

In other words, an ultraviolet beam is radiated to the first photo solder resist layer 140, and then, a part of the first photo solder resist layer 140 covering the surface of the terminal portion 130a is removed through the developing operation to expose the terminal portion 130a, first. Then, the surface of the first photo solder resist layer 140 is abraded just as much as a second photo solder resist layer 150 can be printed at the surface of the first photo solder resist layer 140.

In this manner, the surface of the first photo solder resist layer 140 is adequately abraded with the thickness of the terminal portion 130a always constantly maintained. Accordingly, there can be prevented the problems of the conventional art, such as a terminal portion having a thickness thinner than a planned measurement due to the excessively-abraded first photo solder resist layer or a terminal portion which cannot be exposed to the outside due to insufficiently-abraded first photo solder resist layer.

Figure 5F:
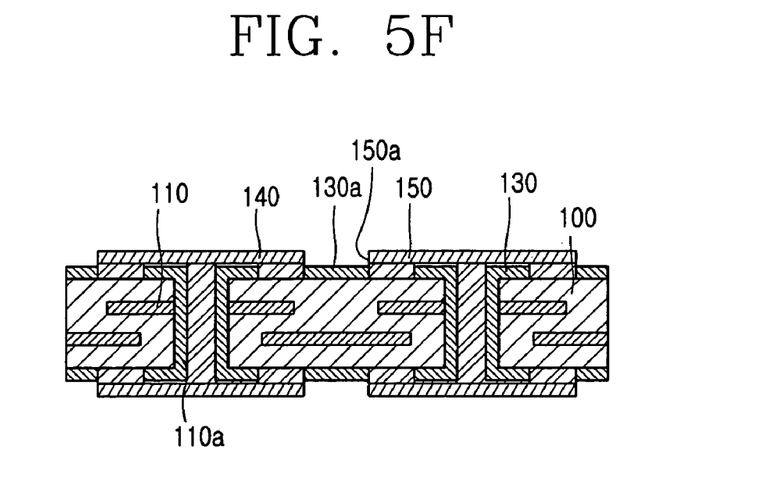

Then, as shown in FIG. 5F, a second photo solder resist layer 150 is printed at the entire surface of the first photo solder resist layer 140. Then, a specific portion of the second photo solder resist layer 150, that is, a portion covering the terminal portion 130a is exposed to a UV beam and developed, thereby forming a pad portion groove 150a. Accordingly, the terminal portion 130a is exposed to the outside, again.

Figure 5G:
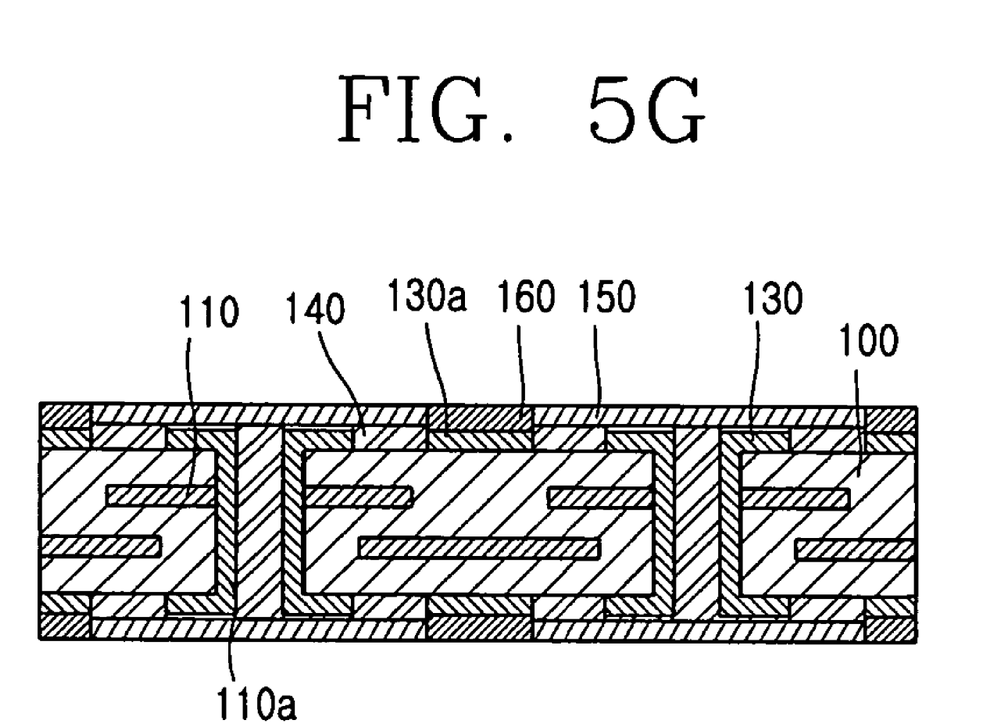

Then, as shown in FIG. 5G, a surface of the exposed terminal portion 130a is plated with gold to form a pad portion 160 as high as the height of the second photo resist layer 150, and the pad portion 160 and the terminal portion 130a are electrically connected. In this manner, the printed circuit board is completed.

As so far described, in the first embodiment of the present invention, in a preceding step of an abrading process, a first photo solder resist layer 140 of photosensitive ink or photosensitive resin material is formed at the surface of the insulating material and the surface of an outer circuit pattern, and then, a part of first photo solder resist layer 140 covering the surface of the terminal potion 130a is removed through the exposure to a UV beam and the developing, so that the terminal portion 130a is exposed, first. Accordingly, a thickness of the terminal portion can be always constantly maintained.

Figure 6A:
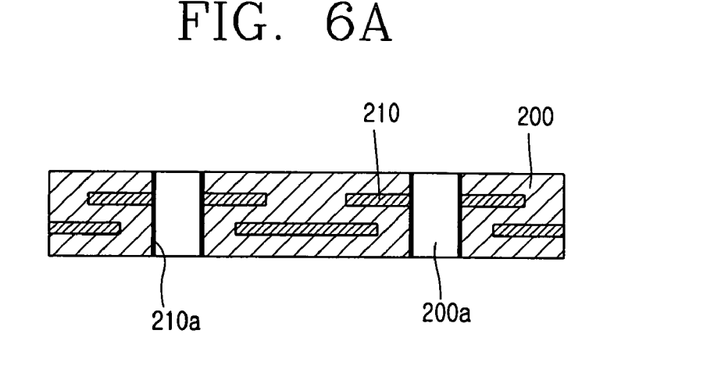
FIGS. 6A to 6F are longitudinal sectional views that sequentially show a method for manufacturing a printed circuit board in accordance with a second embodiment of the present invention.

In the method for manufacturing a printed circuit board in accordance with a second embodiment of the present invention, as shown in FIG. 6A, inner circuit patterns 210 are formed in an insulating material 200 in multi-layers, a plurality of through holes 200a are formed at certain portions of the insulating material 200.

Figure 6B:
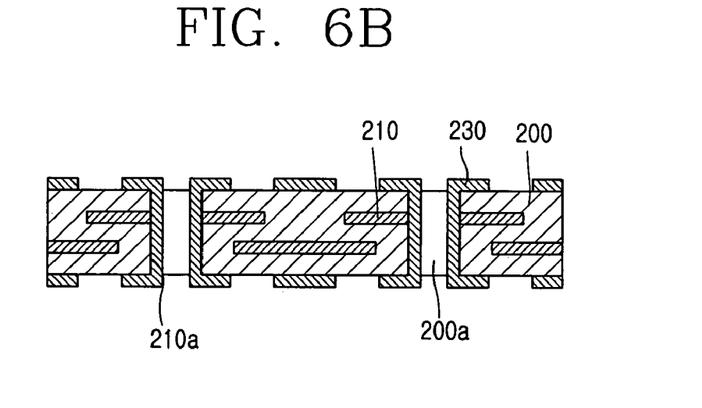

Then, as shown in FIG. 6B, a copper sheet 210a is formed inside the through hole 200a to electrically connect the inner circuit pattern 210 and an outer circuit pattern 230 to be described later.

An outer circuit pattern 230 is formed at an inner circumferential surface of the through hole 200a and a surface of the insulating material 200 and electrically connected to the inner circuit pattern 210. Then, a specific portion of the outer circuit pattern 230 is exposed to light and developed to be removed.

Figure 6C:
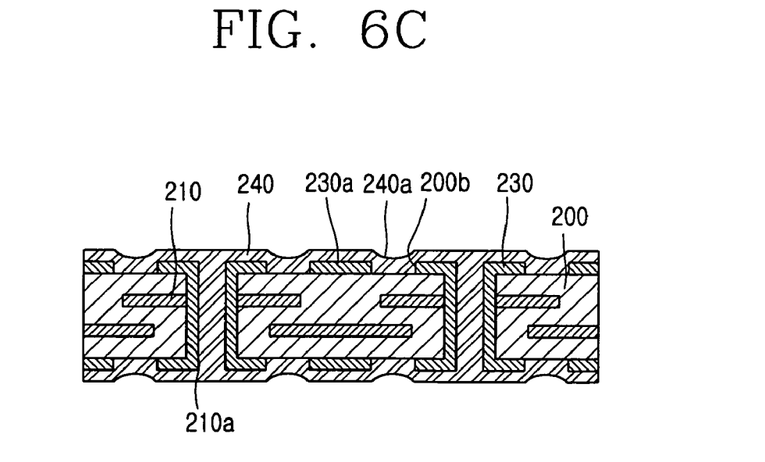

Then, as shown in FIG. 6C, to protect the outer circuit pattern 230, a first photo solder resist layer 240 is formed at an entire surface of the insulating material and an entire surface of the outer circuit pattern 230.

At this time, the first photo solder resist layer 240 is also filled in the through hole 200a. A sinking portion 240a is formed at a specific portion of the first photo solder resist layer 240 by a groove 200b formed by the exposure to light and the developing.

The sinking portion 240a is generated as the specific portion of the first photo solder resist layer 240 is depressed in a process of applying the first photo solder resist layer 240 onto the entire surface of the insulating material and the entire surface of the first photo solder resist layer 240.

A process for manufacturing a printed circuit board in FIGS. 6A to 6C is the same as that of FIGS. 5A to 5C.

Figure 6D:
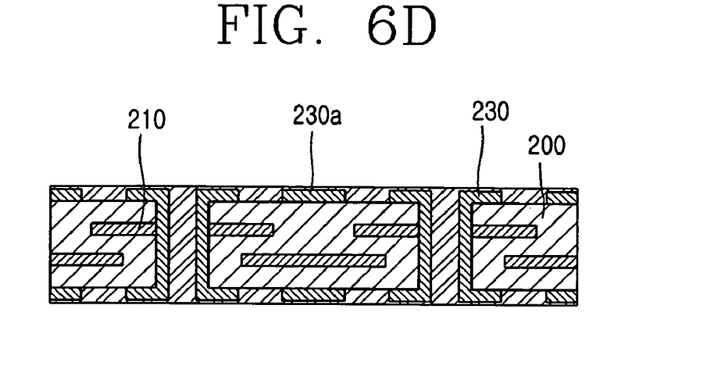

Then, as shown in FIG. 6D, the surface of the first photo solder resist layer 240 is flattened through an abrading process. At this time, the entire surface of the first photo solder resist layer 240 is uniformly abraded just as much as the sinking portion 240a (refer to FIG. 6) can be removed, that is, as deep as the depth of the depression portion 240a.

Figure 6E:
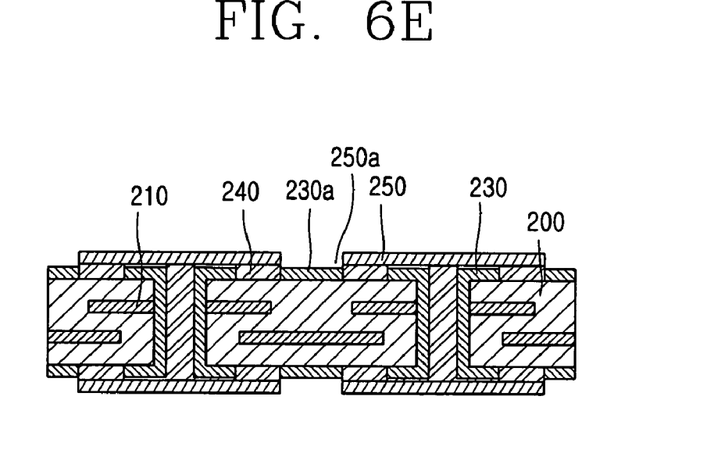

Then, as shown in FIG. 6E, a second photo solder resist layer 250 is printed at the entire surface of the first photo solder resist layer 240. Then, specific portions of the first and second photo solder resist layers, portions covering the terminal portion 230a, are exposed to a UV beam and developed, thereby forming a pad portion groove 250a. Accordingly, the terminal portion 230a is exposed to the outside.

Figure 6F:
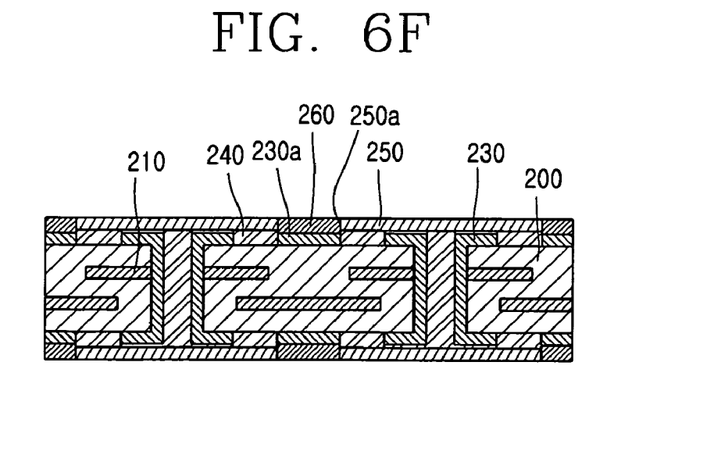

Then, as shown in FIG. 6F, a surface of the exposed terminal portion 230a is plated with gold to form a pad portion 260 as high as the height of the second photo resist layer 250, and the pad portion 260 and the terminal portion 230a are electrically connected. In this manner, the printed circuit board is completed.

As so far described, in the second embodiment of the present invention, the second photo solder resist layer 250 is printed at the surface of the first photo solder resist layer 240, and specific portions of first photo solder resist layer 240 and the second photo solder resist layer 250 are removed together through exposure to a UV beam and developing to expose the terminal portion 230a. Accordingly, the thickness of the terminal portion 230 can be always constantly maintained.

As so far described, by the present invention, a printed circuit board can be more easily manufactured to thereby improve manufacturing efficiency, a yield, performance and quality of a product can be manufactured.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for manufacturing a printed circuit board comprising:

forming inner circuit patterns in an insulating material in multi-layers, forming a plurality of through holes at certain portions of the insulating material, and forming an outer circuit pattern which is electrically connected to the inner circuit pattern, at an inner circumferential surface of the through hole and the surface of the insulating material, and a terminal portion;

forming a first photo solder resist layer at an entire surface of the insulating material and an entire surface of the outer circuit pattern, and exposing the terminal portion by removing a specific portion of the first photo solder resist layer;

abrading the surface of the first photo solder resist layer;

printing a second photo solder resist layer at the surface of the first photo solder resist layer, and exposing the terminal portion to the outside by removing a specific portion of the second photo solder resist layer; and forming a pad portion by plating the surface of the exposed terminal portion with gold, and electrically connecting the pad portion and the terminal portion, wherein, in the removing the specific portions of the first photo solder resist layer, the specific portions of the first photo solder resist layer are exposed to a UV beam and then developed.

2. The method of claim 1, wherein the first and second photo solder resist layers are made of photosensitive ink.

3. The method of claim 1, wherein the first and second photo solder resist layers are made of photosensitive epoxy resin.

4. The method of claim 1, wherein, in the abrading, the surface of the first photo solder resist layer is abraded only as deep as a depth of a sinking portion formed at a specific portion of the first photo solder resist layer.

5. The method of claim 1, wherein, in the removing the specific portions of the second photo solder resist layer, the specific portions of the second photo solder resist layer are exposed to a UV beam and then developed.

6. The method of claim 1, wherein, after the pad portion is formed, the surface of the second photo solder resist layer and the surface of the pad portion are flattened.

7. The method of claim 1, wherein in the forming a pad portion step, the height of the pad portion is plated as high as a height of the second photo solder resist layer.

* * * * *